(12) United States Patent
Houdt et al.

(10) Patent No.: US 6,653,682 B1
(45) Date of Patent: Nov. 25, 2003

(54) NON-VOLATILE ELECTRICALLY ALTERABLE SEMICONDUCTOR MEMORY DEVICE

(75) Inventors: Jan Van Houdt, Bekkevoort (BE); Gang Xue, Heverlee (BE)

(73) Assignee: Interuniversitair Microelektronica Centrum (IMEL,VZW), Leuven (BE)

( * ) Notice: Subject to any disclaimer, the term of this patent is extended or adjusted under 35 U.S.C. 154(b) by 0 days.

(21) Appl. No.: 09/696,616

(22) Filed: Oct. 25, 2000

Related U.S. Application Data
(60) Provisional application No. 60/161,275, filed on Oct. 25, 1999.

(51) Int. Cl.$^7$ .............................................. H01L 29/788
(52) U.S. Cl. ...................... 257/315; 257/316; 257/317; 257/321
(58) Field of Search ................................ 257/314, 315, 257/316, 317, 321, 322; 438/257, 263, 264

(56) References Cited

U.S. PATENT DOCUMENTS

| | | |
|---|---|---|
| 4,794,565 A | 12/1988 | Wu et al. |
| 5,029,130 A | 7/1991 | Yeh |
| 5,091,882 A | 2/1992 | Naruke |
| 5,235,544 A | 8/1993 | Caywood |
| 5,280,446 A | 1/1994 | Ma et al. |
| 5,284,784 A | 2/1994 | Manley |
| 5,338,952 A | 8/1994 | Yamauchi |
| 5,394,360 A | 2/1995 | Fukumoto |
| 5,572,054 A | 11/1996 | Wang et al. |
| 5,583,810 A | 12/1996 | Van Houdt et al. |
| 5,583,811 A | 12/1996 | Van Houdt et al. |
| 5,659,504 A * | 8/1997 | Bude et al. ............. 365/185.12 |
| 5,821,581 A * | 10/1998 | Kaya et al. .................. 257/315 |
| 5,969,991 A | 10/1999 | Van Houdt et al. |
| 6,272,050 B1 * | 8/2001 | Cunningham et al. . 365/185.28 |

FOREIGN PATENT DOCUMENTS

| | | |
|---|---|---|
| WO | WO 99/13513 | 3/1999 |

OTHER PUBLICATIONS

Y. Miyawaki et al., IEEE J. Solid–State Circuits, vol. 27, p. 583, 1992.
T. Tanaka et al., IEEE J. Solid–State Circuits, vol. 29, p. 1366, 1994.
J. Van Houdt et al., 11th IEEE Nonvolatile Semiconductor Memory Workshop, Feb. 1991.
J. Van Houdt et al., IEEE Trans. Electron Devices, vol. ED–40, p. 2255, 1993.
J. Van Houdt et al., IEEE Transactions on Electron Devices, vol. 39, No. 5, May 1992.
Y. Yamauchi et al., IEDM Tech. Dig., p. 319, 1991.
"An 18Mb Serial Flash EEPROM for Solid–State Disk Applications," by D.J. Lee et al., paper presented at the 1994 Symposium on VLSI Circuits, tech. digest p. 59.
"A 5 Volt high density poly–poly erase Flash EPROM cell," by R. Kazerounian, paper presented at the 1988 International Electron Devices Meeting, tech. digest p. 436.

* cited by examiner

Primary Examiner—Thien Tran
(74) Attorney, Agent, or Firm—McDonnell Boehnen Hulbert & Berghoff

(57) ABSTRACT

Apparatus for an electrically programmable and erasable memory device and methods for programming, erasing and reading the device. The device has a single transistor including a source, a drain, a control gate and a floating gate positioned between the control gate, the source and the drain, where the floating gate is capacitively coupled to the drain. At least one part of the floating gate is partly positioned between the control gate, the drain and the source, and the other part of the floating gate overlaps with the drain. Further, the single transistor of the device includes means for injecting hot electrons generated by the drain induced secondary impact ionization onto the floating gate. Additionally, the means are arranged to induce Fowler-Nordheim tunnelling of charges from the floating gate to the drain.

20 Claims, 7 Drawing Sheets

NON-VOLATILE ELECTRICALLY ALTERABLE SEMICONDUCTOR MEMORY DEVICE

REFERENCE TO RELATED APPLICATIONS

This application claims priority benefits to the U.S. provisional application Serial No. 60/161,275 filed on Oct. 25, 1999. This application incorporates by reference in its entirety the U.S. provisional application Serial No. 60/161,275, filed on Oct. 25, 1999.

FIELD OF THE INVENTION

The present invention relates to fast programmable Electrically Erasable Programmable Read-Only Memory devices and method for operating such devices.

BACKGROUND OF THE INVENTION

Nowadays, most Flash memories use Channel Hot Electron Injection ("CHEI") at the drain side of the memory cell, or Fowler-Nordheim Tunnelling ("FNT") for programming. The Channel Hot Electron Injection mechanism provides a relatively high programming speed (~10 μs) at the expense of a high power consumption (~400 μA/bit) which limits the number of cells that can be programmed simultaneously (so-called page-mode programming) to a maximum of 8 bytes (Y. Miyawaki et al., IEEE J. Solid-State Circuits, vol.27, p.583, 1992). Furthermore, in order to allow a further scaling of the transistor dimensions towards 0.18 μm and below, supply voltage scaling from 3.3V towards 1.8V also becomes mandatory. This supply voltage scaling is known to degrade the Channel Hot Electron Injection efficiency and, hence, the corresponding programming speed considerably. These memories already use a bitline charge pump to provide a 4–5V drain voltage to the cell during programming and erasing. The problem with this solution is two-fold: (1) since the internally generated programming voltages are not scaled down with respect to the technology generation, it becomes practically impossible to further scale the cell itself, in terms of both vertical (dielectric thicknesses) and lateral (gate length) dimensions; (2) due to the high power needed to trigger the Channel Hot Electron Injection, it becomes harder and harder to supply these voltages on-chip from a high voltage generator or charge pumping circuit. Also, the relative area of the charge pumps and the corresponding high-voltage switching circuitry increases with respect to the useful area of the memory chip.

On the other hand, tunnelling provides slower programming times (~100 μs) and a low power consumption which allows larger pages (~4 kbit) in order to reduce the effective programming time to 1 μs/byte (T. Tanaka et al., IEEE J. Solid-State Circuits, vol.29, p.1366, 1994). However, a further improvement is limited by tunnel-oxide scaling limits and by the very high voltages (~15V) needed on chip for Fowler-Nordheim Tunnelling, both compromising device reliability and process scalability.

The recent success of Source-Side Injection ("SSI") as a viable alternative over Fowler-Nordheim Tunnelling and Channel Hot Electron Injection for Flash programming is mainly due to its unique combination of moderate-to-low power consumption with very high programming speed at moderate voltages. A typical example of such a device relying on Source-Side Injection for programming is the High Injection Metal-Oxide-Semiconductor or HIMOS® memory cell (J. Van Houdt et al., 11th IEEE Nonvolatile Semiconductor Memory Workshop, February 1991; J. Van Houdt et al., IEEE Trans. Electron Devices, vol.ED-40, p.2255, 1993). As also described in the U.S. Pat. Nos. 5,583,810 and 5,583,811, a speed-optimized implementation of the HIMOS® cell in a 0.7-μm CMOS technology exhibits a 400 nanoseconds programming time while consuming only a moderate current (~35 μA/cell) from a 5V supply. This result is obtained when biasing the device at the maximum gate current, i.e. at a control-gate voltage ($V_{cg}$) of 1.5V. The corresponding cell area is in the order of 15 μm² for a 0.7-μm embedded Flash memory technology when implemented in a contactless virtual ground array as described in pending application Ser. No. 08/426,685, incorporated herein by reference. In terms of the feature size F (i.e. the smallest dimension on chip for a given technology), this corresponds to ~30F² for a 0.7-μm technology. This is fairly large as compared to the high density Flash memory concepts which are all in the ~10F² range.

However, due to the growing demand for higher densities, also in embedded memory applications like e.g. smart-cards and embedded microcontrollers, a continuous increase in array density and the scaling of the supply voltage become mandatory. This evolution calls for more aggressive cell-area scaling and for low-voltage and low-power operation. In the co-pending application Ser. No. 08/694,812, incorporated herein by reference, a programming scheme is described which reduces the power consumption during the write operation considerably. Also, the used write voltages are expected to scale with the supply voltage $V_{supply}$ since the Source-Side Injection mechanism only requires the floating-gate channel to stay in the linear regime for fast programming (see e.g. J. Van Houdt et al., IEEE Trans. Electron Devices, vol. ED-40, p.2255, 1993). Therefore, the necessary Program-Gate voltage $V_{pg}$ for fast programming is given by:

$$V_{pg} \approx (V_{supply} + V_{th})/p \tag{1}$$

wherein $V_{th}$ is the intrinsic threshold voltage of the floating gate transistor (~0.5V) and p is the coupling ratio from Program Gate to Floating Gate (typically ~50%). According to Eq.(1), $V_{pg}$ is thus expected to scale twice as fast as the supply voltage in a first order calculation. It can be concluded that the high programming voltage is scaling very well with the supply voltage and offers enough margin in order for the high voltage circuitry to follow the minimum design rule. These and other features described in the related patents and patent applications indicate the high scalability of the HIMOS® concept in comparison with the traditional cells that use drain multiplication or tunnelling.

However, there are some drawbacks in the HIMOS® cell concept. First, there is a drawback of the additional program gate, which increases the cell area considerably in the case of a double polysilicon technology. Furthermore, since both a control gate and a program gate are formed in the same polysilicon layer, the process requires special polysilicon etching recipes in order to remove the polysilicon stringers between the control gate and the program gate. Another drawback is related to the decoder design. Since the cell is erased with negative gate voltages on the control gate and program gate, as described in the pending application "Method of erasing a Flash EEPROM memory cell optimized for low power consumption", U.S. Pat. No. 5,969,991 issued Oct. 19, 1999, a pMOS transfer gate is required in the row decoder. During read-out (a program gate voltage is set to zero) and during the write/read deselect operations (a control gate voltage is set to zero), a negative voltage is required to switch the ground potential onto the gates of the array. This in turn requires a small charge pump in the row decoder, which has a small but negative impact on the access time and power consumption. Further, there is a reliability problem associated with the program gate's disturb phenomenon. After a cell has been programmed, the high program gate's programming voltage (typically 9V in a 0.35 μm technology) can cause discharging of this cell while programming other cells on the same row. Alternatively, erased cells can be slowly programmed because of tunnelling through the tunnel oxide. Further, another problem is due to the appearance of Stress-Induced Leakage Current ("SILC"). When the cell has been written and erased for a large number of times, the tunnel oxide quality is deteriorated in such a way that the application of a small read-out voltage at the drain can cause slow discharging of programmed cells. Even though this is a very small leakage current, it has to be controlled for the entire lifetime of the device that is typically 10 years.

There have been many attempts to obtain a smaller cell using 3 polysilicon layers, as described in a co-pending PCT patent application Ser. No. PCT/BE98/00134, WO 9913513, filed Sep. 9, 1998. Other references to such devices are: (1) U.S. Pat. No. 5,284,784, issued Feb. 8, 1994, to Martin H. Manley; (2) U.S. Pat. No. 5,091,882, issued Feb. 25, 1992, to K. Naruke; (3) U.S. Pat. No. 4,794,565, issued Dec. 27, 1988, to A. T. Wu et al. (4) U.S. Pat. No. 5,235,544, issued Aug. 10, 1993, to J. Caywood; (5) U.S. Pat. No. 5,338,952, issued Aug. 16, 1994, to Y. Yamauchi; (6) U.S. Pat. No. 5,280,446, issued Jan. 18, 1994, to Y. Y. Ma et al.; and (7) U.S. Pat. No. 5,394,360, issued Feb. 28, 1995, to T. Fukumoto. These references all suffer from a number of significant disadvantages that are discussed now in more detail.

The first four referenced patents (Manley, Naruke, Wu and Caywood) all describe so-called "sidewall gate" devices (FIG. 1). In each of these devices, the floating gate is formed in the first polysilicon layer, while the select gate is formed by a polysilicon sidewall spacer. This spacer can be formed in the second polysilicon layer (Manley, FIG. 1a) or in the third one (Wu, Naruke, Caywood, FIG. 1). There are main disadvantages associated with these sidewall-gate devices. First of all, the sidewall select gate is formed by depositing a polysilicon layer on the chip which is then removed selectively by using anisotropic (dry) etching techniques. However, it is very difficult to control this selective etching operation. For example, the width of the spacer remaining after etching determines the effective channel length during programming and this parameter should be tightly controlled. Therefore, this technique is not to be considered as a standard process step for CMOS. Also, after this anisotropic etch, the remaining sidewall is not only present on the source side of the device, but it will be a ring around the first and eventually also the second polysilicon gate(s). To correct for this problem, an additional photo step is required. Further, since the select gate controls a short portion of the channel, it needs to switch off the transistor channel in some cases, e.g. when reading/writing a particular cell the select gates of the (erased) cells sharing the same bitline have to be able to reduce their channel current to zero in order to prevent leakage currents and/or unwanted programming in the array. Usually, the thickness of the polysilicon, which determines the width of the spacer, is smaller than the minimum feature size that compromises the hard-off situation which in turn is highly desired in a memory array.

Further, the efficiency of the Source Side Injection mechanism is closely linked to the thickness of the oxide spacing in between the select and the floating gate (see e.g. J. Van Houdt et al., IEEE Transactions on Electron Devices, vol.39, no.5, May 1992). By putting the sidewall right next to the control gate (Wu, Naruke, Caywood), the oxide spacing has to remain fairly thick since it also has to isolate the high control gate voltage during programming from this sidewall gate. Therefore, the injection efficiency is compromized by isolation requirements. Also, since the part of the transistor channel which is controlled by the sidewall gate is much shorter than the part controlled by the floating gate, a larger portion of the external drain voltage will be lost for the channel hot-electron generation at the injection point. However, the main problem with these devices is the difficulty for contacting the cells in a large array of memory cells.

The sidewall gate is also used for wiring, and this has a considerable negative impact on the parasitic resistance in a large memory array, as explained in U.S. Pat. No. 5,394,360, issued Feb. 28th, 1995, to T. Fukumoto (col.1, lines 37–41). The 5th reference (U.S. Pat. No. 5,338,952, issued Aug. 16th, 1994, to Y. Yamauchi) removes some of the problems mentioned above by forming the floating gate as a polysilicon sidewall spacer (FIG. 1c). However, some drawbacks of the sidewall-gate device are still present in this memory cell. First of all, the sidewall select gate is still formed by depositing a polysilicon layer on the chip that is then removed selectively by using anisotropic (dry) etching techniques. In this case, the width of the spacer remaining after etching determines the effective channel length during the read-out process, and this parameter should be tightly controlled. Further, if electrons are stored on the floating sidewall gate, the portion of the channel controlled by this sidewall has to be switched off efficiently, which is not evident. As already mentioned above, the thickness of the polysilicon that determines the width of the spacer is usually smaller than the minimum feature size, which compromises the hard-off situation that is highly desired in a memory array. Eventually, the cell may exhibit a soft-on and a hard-on state instead of hard-off/hard-on states as required for fast access. Furthermore, since erasing is now to be achieved from the sidewall towards a sufficiently underdiffused drain junction, the effective channel controlled by the spacer is even smaller. This makes the leakage problem during read-out even more critical.

As in the previous cases, after the anisotropic etch, the remaining sidewall is not only present on the drain side of the device, but it will be a ring around the select gate. To correct for this, an additional photo step is required. Further, since the floating gate is a sidewall spacer, the coupling ratio between the control gate (3rd polysilicon) and this floating gate will be rather small. Indeed, referring to FIG. 1 in the Yamauchi application, it is clear that the couplings from the floating sidewall gate towards the control gate, substrate/drain and select gate are on the same order of magnitude. This implies that the high programming voltage is still 12V in a 0.5 μm CMOS technology (see the corresponding conference paper "A 5V-only virtual ground Flash cell with an auxiliary gate for high density and high speed applications", by Y. Yamauchi et al., IEDM Tech. Dig., p.319, 1991). Consequently, the voltage difference between the control gate and the select (or auxiliary) gate exceeds 10V during programming which compromises the scaling of the 2nd interpoly layer (layer 12 in FIG. 1 of the discussed application). Thus, this dielectric layer will have to remain relatively thick (200 Å) according to the application (col.4, line 46). This will further decrease the coupling ratio between the control gate and the floating gate, since the oxide between the sidewall and the select gate has to scale because of its impact on the source-side injection efficiency (see above).

The only solution is to increase the coupling ratio by adding coupling area (so-called wings) between the control gate and the floating gate. However, this solution compromises the major advantage of this cell, which is its high integration density. Additionally, the erase voltage is still very high (−11V according to the application), which makes the concept unsuited for embedded memory applications where these high negative voltages would introduce too high an additional processing cost. This high erase voltage is again a consequence of the fairly low coupling ratio towards the sidewall gate.

Ma et al. (referenced patent 6) disclose an alternative memory cell with 3 polysilicon layers, which also uses the source-side injection mechanism (FIG. 1d). The major difference with the previously discussed prior art is the absence of a sidewall gate. Instead, first and second poly are etched in a stacked way and the select gate is added on top by a 3rd polysilicon layer. Some major disadvantages are given hereafter. First of all, it is well-known that such a processing scheme introduces considerable complexity which makes it impossible to use in an embedded memory application. On the other hand, the used erase voltage is still −12V provided that the bitline is biased at 5V. In future generations (when the supply voltage and hence also the bitline voltage go down), aggressive tunnel oxide scaling will be required in order not to have an increase of this negative voltage. Further, the oxide spacing between the select gate and the control gate has to be kept quite thick because this oxide also serves to isolate the high programming voltage from the select gate in order not to have a soft-erase effect or even oxide breakdown during programming. This restriction compromises scaling in general and, more in particularly, decreases the injection efficiency which is directly linked to the thickness of this spacing as explained extensively by J. Van Houdt et al. in IEEE Transactions on Electron Devices, vol.39, no.5, May 1992. U.S. Pat. No. 5,394,360, issued Feb. 28th, 1995, to T. Fukumoto, describes several embodiments of source-side injection cells.

The embodiment disclosed in FIG. 2 of the above-mentioned patent suffers from the same disadvantages as the device described by Ma et al. (see above). The second embodiment (FIG. 4 in that patent and FIG. 2 in the present application) still suffers from problems. For example, the dielectric determining the injection efficiency that is used for the spacing between select gate and control gate also has to provide sufficient isolation between the high programming voltage (2nd polysilicon) and the (low) select gate voltage during programming (3rd polysilicon). When examining the numbers from this patent, the control gate will be pulsed to 14–15V and the select gate is biased at 1.5V during programming (col.2, lines 59–64). This implies that the second interpoly dielectric is subject to a stress of 12.5–13.5V. Obviously, this layer can not be made very thin and, hence, the injection efficiency will be compromised since the same layer is also serving as the spacing oxide between select gate and floating gate (see FIG. 2).

A second problem with the Fukumoto cell is the following: the second polysilicon (control) gate should cover most of the floating gate in order to increase the coupling ratio and hence reduce the programming voltage. On the other hand, this overlap is limited due to design rules since the "offset region" (col.1, line 59) has to be covered uniquely by the third polysilicon gate for having a functional cell. In practice, this layout rule will be about ½ of the feature size due to misalignment considerations (see FIG. 2). Since the floating gate has to be scaled as much as possible to minimize capacitive coupling ratios towards all terminals other than the control gate, its length will be ~F in an efficient cell design. This implies that only 50% of the floating gate area will actually contribute to the coupling ratio. The statement (col.3, lines 34–37) that "the second gate electrode is provided so as not to enter (overlap) the offset region and to be directly capacitively-coupled with the whole surface of the floating gate" is, therefore, a contradiction. Making sure that the second gate does not overlap the offset region implies that only part of the floating gate area contributes to the coupling ratio from control gate to floating gate and in turn explains why 14–15V is still typically used for programming the cell.

In a pending application, "Non-volatile memory cell", PCT patent application Ser. No. PCT/BE98/00134, WO 9913513, filed Sep. 9, 1998, a device architecture is claimed which circumvents the above-mentioned problems yielding a very compact though still CMOS-compatible geometry that paves the way to high-density and low-voltage memory applications. Although the above-mentioned application Ser. No. PCT/BE98/00134, WO 99/13513 solves the above-mentioned problems, it still requires 3 polysilicon layers which is much more complicated for the processing of the chip than a double polysilicon scheme.

Other references to memory devices that are relevant with respect to the present invention are listed below: (1) U.S. Pat. No. 5,029,130, issued Jul. 2, 1991, listed inventor B. Yeh; (2) "An 18 Mb Serial Flash EEPROM for Solid-State Disk Applications", by D. J. Lee et al., paper presented at the 1994 Symposium on VLSI Circuits, tech. digest p.59; (3) "A 5 Volt high density poly-poly erase Flash EPROM cell". by R. Kazerounian, paper presented at the 1988 International Electron Devices Meeting, tech. digest p.436; (4) U.S. Pat. No. 5,572,054, issued on Nov. 5, 1996, listed inventors Wang et al. These references all suffer from a variety of problems such as a high processing complexity and/or the need for high erase voltages.

Yeh et al. show a split gate cell with a very complicated interpoly formation scheme which, again, makes this concept unsuited for embedded memory. The used erase voltage is still 15V although special processing features have been introduced specifically to enhance the interpoly conduction for efficient erasure. The papers by Lee and by Kazerounian show less details on processing issues, but it is clear from the disclosure that the erase voltages are in the order of 20V in order to tunnel through a polyoxide.

Wang et al. (U.S. Pat. No. 5,572,054) describes an electrically programmable and erasable memory device which comprises at least one transistor. This transistor comprises a substrate which is provided with a source, a drain and a channel region extending between the source and the drain. The substrate has a split point situated between the source and the drain which forms a separation between a first region extending from the split point towards the drain and a second region extending from the split point towards the source. A first insulating layer is applied on the substrate and extends in the second region over a portion of the source and the channel region. A second insulating layer is applied on the substrate in the first region, where it separates the substrate from a control gate. The second insulating layer further extends in the second region where it contacts the control gate. A floating gate is sandwiched between the first and second insulating layers and extends over a portion of the source to be capacitively coupled to the source. This transistor structure is commonly known in the art as a "split gate" structure.

There are n-channel and p-channel devices with split gate transistors. In the n-channel devices, the source and drain are doped with an n-type dopant and the substrate is doped with a p-type dopant. In p-channel devices, the source and drain are doped with a p-type dopant and the substrate is doped with an n-type dopant. The device described in U.S. Pat. No. 5,572,054 is an n-channel device. This implies that electrons flow through the channel region from the drain towards the source. In p-channel devices, the electrons flow from source to drain, which implies in p-channel split gate transistors the floating gate is located in the region extending from the split point towards the drain.

The floating gate of the device described in U.S. Pat. No. 5,572,054 can be charged to obtain a programmed state and discharged to obtain a non-programmed or erased state of the memory cell. Programming the floating gate means that electrons are introduced onto the floating gate. Erasing means that electrons are removed from the floating gate. Assuming that the floating gate is in an erased state, i.e. positively charged, programming the transistor, i.e. charging the floating gate, is conducted as follows. A ground potential is applied to the drain, a low positive voltage (e.g. +1 V) is applied to the control gate and a high positive voltage (e.g. +12 V) is applied to the source. The high voltage difference between drain and source causes electrons to migrate through the channel from the drain towards the source, i.e. the channel region becomes conductive and is "turned on." The positive voltage on the control gate serves to transfer the drain potential onto the split point. When the electrons reach the split point, they see a steep potential drop as the influence of the positive voltage on the control gate diminishes in this point. The steep potential drop is approximately equal to the source potential and causes them to be accelerated or "heated". Due to the capacitive coupling with the source, the floating gate attracts the heated electrons, which causes some of them to be injected through the first insulating layer onto the floating gate. This process continues until the positive charges on the floating gate are neutralised by the electrons injected onto it and the floating gate is no longer positively charged, which results in the portion of the channel region beneath the floating gate being "turned off", i.e. it is no longer conductive. This method of charging the floating gate is commonly known in the art as channel hot electron injection (CHEI).

Assuming that the floating gate is in a programmed state, i.e. negatively charged, erasing the transistor, i.e. discharging the floating gate is conducted as follows. A ground potential is applied to the source and the drain, and a high positive voltage (e.g. +15 V) is applied to the control gate. The high potential of the control gate causes electrons on the floating gate to travel through the second insulating layer to the control gate by means of the Fowler-Nordheim tunneling mechanism, which is known to the person skilled in the art.

The memory cell described in U.S. Pat. No. 5,572,054 however has the disadvantage that high voltages are needed for both programming and erasing the memory cell. Because of these high voltages, the first and second insulating layers need to have a substantial thickness in order to avoid breakdown. Furthermore, particular circuits, such as for example charge pumping circuits, are required to achieve the high programming and erasing voltages, since these voltages are above the supply voltage of the device, which is commonly about 5 volts. This can lead to an increase in the size of the memory device.

AIMS OF THE INVENTION

An aim of the invention is to develop a high density memory device having fast programming capabilities, using low voltages, being scalable and being easy to process.

Another aim of the invention is to present an electrically programmable and erasable memory device in which the voltages used for programming and erasing are less than those used in the prior art.

SUMMARY OF THE INVENTION

The aim of the invention is achieved in that said first insulating layer and said overlap are dimensioned in such a way as to create a capacitive coupling between said floating gate and said drain enabling injection onto the floating gate of hot electrons generated by drain induced secondary impact ionisation.

The mechanism used in the device of the invention for programming the transistor, drain induced secondary impact ionisation, can be explained as follows. A voltage difference is applied over the channel region in such a way that hot electrons flow from source to drain. As these hot electrons impact on the drain, they transfer a certain amount of their energy onto the drain. As a result, the drain is ionised, meaning that electrons come loose from the drain. These so-called "secondary electrons" are heated as they receive energy from the electrons impacting on the drain. Due to the capacitive coupling of the floating gate with the drain, by which part of the voltage on the drain is induced on the floating gate, the secondary electrons are attracted by the floating gate. Some of them have sufficient energy to diffuse through the first insulating layer and be injected onto the floating gate. The mechanism of drain induced secondary impact ionisation allows the programming and erasing of the transistor at more moderate voltages with respect to the prior art.

In a preferred embodiment of the device of the invention, the substrate is negatively biased with respect to the source during programming of the transistor. Biasing the substrate negatively with respect to the source has the advantage that the electric field which is present over the first insulating layer and is caused by the voltage difference between the floating gate and the substrate, can be enhanced. An enhancement in this electric field causes the secondary electrons to be more attracted to the floating gate. As a result, biasing the substrate negatively with respect to the source can lead to an enhancement of the programming speed.

In a further preferred embodiment of the device of the invention, a drain junction is provided between the drain and the substrate, which drain junction has a depth larger than the overlap between the floating gate and the drain. This deep drain junction is preferably provided with a halo extension. By providing such a drain junction, the mechanism of drain induced secondary impact ionisation can be enhanced, resulting in a further enhancement of the programming speed.

The capacitive coupling between the floating gate and the drain is preferably constructed such that it enables tunnelling, preferably Fowler-Nordheim tunnelling, of electrons from said floating gate to said drain for erasing the transistor. In order to enable tunnelling of electrons from the floating gate and a target, a capacitive coupling between the floating gate and the target is required. This capacitive coupling is preferably between predetermined values. A capacitive coupling of too low value is undesirable for tunnelling, because this implies that there is either substantially no overlap between the floating gate and the target, or that the insulating layer between the floating gate and the target is too thick to enable tunnelling at a moderate voltage. A capacitive coupling of too high value is also undesirable for tunnelling, because a high capacitive coupling results in a large part of the voltage applied to the target being induced on the floating gate, so that at a moderate voltage, the voltage difference between the target and the floating gate remains too low to achieve tunnelling.

Programming the transistor of the device in one embodiment of the invention comprises the steps of applying a source voltage to the source, applying a control gate voltage to the control gate and applying a drain voltage to the drain. The drain voltage has a higher voltage value than the control gate voltage, which in its turn has a higher voltage value than the source voltage. As the control gate voltage is below the drain voltage, the device of the invention allows the use of more moderate voltages for programming with respect to the prior art.

Erasing the transistor of the device in one embodiment of the invention comprises the steps of applying a source voltage to the source, applying a control gate voltage to the control gate and applying a drain voltage to the drain. The drain voltage has a higher voltage value than the control gate voltage and the source voltage, which are preferably supplied with the ground potential. As a result of the suitable capacitive coupling between the floating gate and the drain as described above, the device of the invention allows the use of more moderate voltages for erasing with respect to the prior art.

Reading the transistor of the device of the invention comprises the steps of applying a source voltage to the source, applying a control gate voltage to the control gate and applying a drain voltage to the drain. The control gate voltage has a higher voltage value than the source voltage, which in its turn has a higher voltage value than the drain voltage. This method of reading the transistor can be termed "reverse read-out," because the third source voltage is higher than the drain voltage, which is preferably the ground potential. The reverse read-out has the advantage that a low voltage, preferably the ground potential, is applied to the drain during reading, which serves to avoid a leakage current from the floating gate to the drain.

These and other advantages of the invention will be more apparent to one of the ordinary skill in the art after reading the detailed description section with references to the accompanying drawings.

DETAILED DESCRIPTION OF EXEMPLARY EMBODIMENTS

Figure 1A:
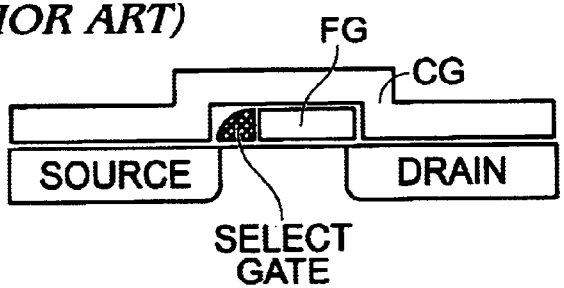
FIG. 1 shows a cross-sectional view of prior art devices, with FIGS. 1a and 1b showing typical sidewall-gate structures, FIG. 1c showing a prior art sidewall-gate structure where the sidewall serves as the floating gate and FIG. 1d showing a prior art split-gate structure employing three polysilicon layer.
Figure 1B:
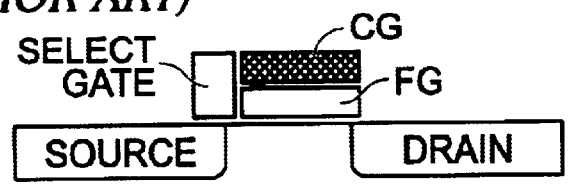
Figure 1C:
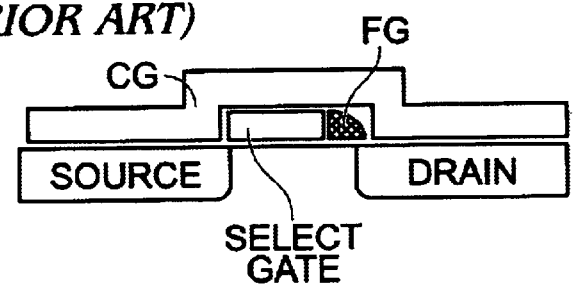
Figure 1D:
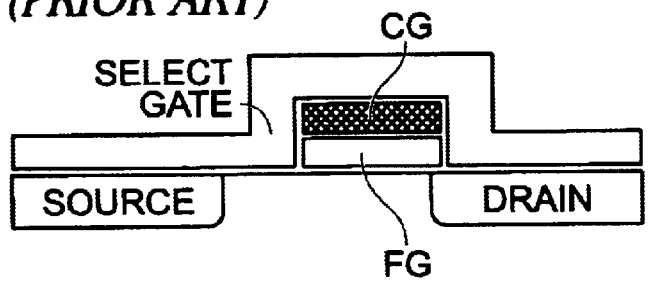
Figure 2:
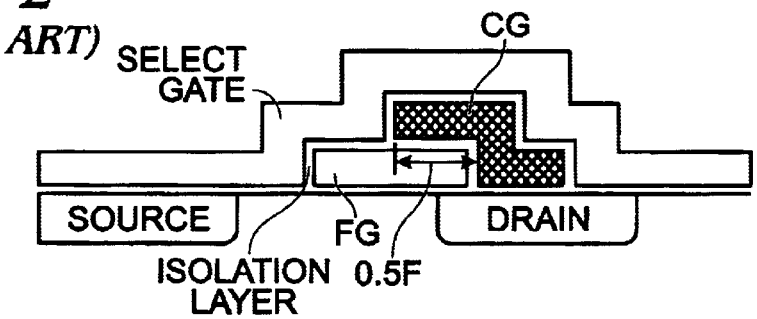
FIG. 2 shows a cross-section of a prior art memory cell having conflicting requirement of the second interpoly dielectric layer.
Figure 3:
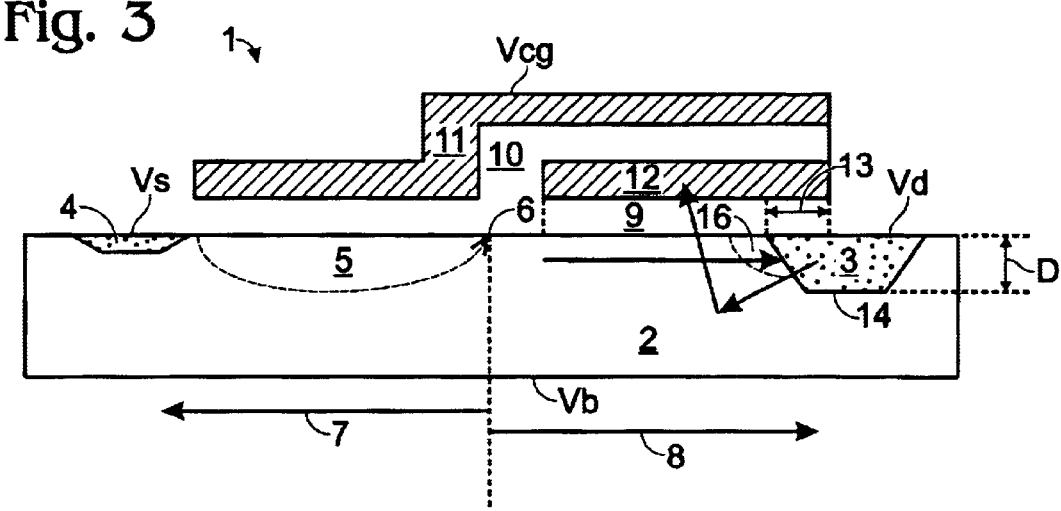
FIG. 3 shows a cross-sectional side view of a preferred embodiment of a transistor of a device according to an exemplary embodiment.

Referring to the drawings, FIG. 3 is a block diagram illustrating a device arranged to employ exemplary embodiments of the present invention. As shown in FIG. 3, the device comprises a transistor 1 having a substrate 2 provided with a drain 3, a source 4, and a channel region 5 extending between the source 4 and the drain 3. The substrate 2 has a split point 6 between the source 4 and the drain 3. The split point 6 forms a separation between a first region 7 extending from the split point 6 in a first direction towards the source 4 and a second region 8 extending from the split point 6 in a second direction towards the drain 3. A first insulating layer 9 is applied on the substrate 2 and extends in the second region 8 over at least a portion of the drain 3 and at least a portion of the channel region 5. A second insulating layer 10 is applied on the substrate 2 in the first region 7, where it separates the substrate 2 from a control gate 11. The second insulating layer 10 extends further in the second region 8, where it contacts the control gate 11. Further, the device has a floating gate 12 positioned between the first insulating layer 9 and the second insulating layer 10. The floating gate 12 extends in the second region 8 over the channel region 5 and over at least a portion of the drain 3 to establish an overlap 13 between the floating gate 12 and the drain 3. The first insulating layer 9 and the overlap 13 are positioned in such a way that a capacitive coupling is created between the floating gate 12 and the drain 3. This capacitive coupling enables the injection of hot electrons onto the floating gate 3.

According to the exemplary embodiment, the hot electrons are generated by a drain induced secondary impact ionization.

In the device according to an exemplary embodiment, the first insulating layer 9 as well as the overlap 13 between the floating gate 12 and the drain 3 are arranged in such a way that a capacitive coupling is created between the floating gate 12 and the drain 3. Thus, the injection of hot electrons onto the floating gate 3 is possible, where the hot electrons are generated by a drain induced secondary impact ionization. Primary electrons, i.e. hot electrons migrating through the channel region 5 from source 4 to drain 3, require less energy for impact ionizing the drain 3 than they require for being injected onto the floating gate 12. The reason is that the injection onto the floating gate 12 requires a lot of energy to be able to cross the first insulating layer 9. As a result, a lower voltage difference between drain 3 and source 4 is required for heating the primary electrons when they are used for impact ionization of the drain 3 instead of injection onto the floating gate 12. Therefore, only a moderate voltage needs to be supplied to the drain 3 for heating the primary electrons. Further, a thinner first insulating layer 9 is possible, as the voltage difference between the drain 3 and the floating gate 12 will never be as large as when the primary electrons are used for injection onto the floating gate 12. Further, the first insulating layer 9 can be constructed thinner as there is a lower risk of breakdown. Since the first insulating layer 9 can be constructed thinner, the amount of energy required for injection of hot electrons onto the floating gate 12 is reduced. This in turn allows the use of secondary electrons for charging the floating gate 12 in the device according to the exemplary embodiment. Therefore, the device has an advantage that the voltage applied to the drain 3 for programming the transistor can be reduced, less than the voltage necessary for application to the source of prior art devices such as the device of U.S. Pat. No. 5,572,054.

By providing the split point 6, electrons migrating through the channel region 5 can become sufficiently heated by a steep potential drop and may ionize the drain 3. This shows that a lower voltage with respect to the source 4 can be applied to the drain 3. This has the advantage that the voltage difference over the channel region 2 can be reduced, less than is required in prior art devices such as the device of U.S. Pat. No. 5,572,054.

Further, according to an exemplary embodiment, the capacitive coupling between the floating gate 12 and the drain 3 results in a part of the drain voltage being induced on the floating gate 12, enabling the floating gate 12 to attract the secondary electrons. As a result, the control gate voltage is no longer used for attracting the secondary electrons towards the floating gate 12. According to an exemplary embodiment, the control gate 11 is only used for biasing the channel region 5 in the first region 7 extending from the split point 6 towards the source 4, in such a way that the source voltage is transferred onto the split point 6. The control gate 11 in the first region 7 is only separated from the substrate 2 by the second insulating layer 10, and not also by the first insulating layer 9 and the floating gate 12 as in the stacked gate transistor. Thus, the control gate 11 is nearer the substrate 2 in the first region 7. Further, providing the capacitive coupling has the advantage that the control gate voltage required for programming the transistor 1 can be reduced as compared to prior art devices such as the device in U.S. Pat. No. 5,659,504. Furthermore, the voltage required on the control gate 11 for programming the transistor in the device according to the exemplary embodiment can be below the voltage applied to the drain 3.

The device according to the exemplary embodiment can be operated at low voltages than prior art devices and thus consumes less power. Moreover, the device of the current invention is smaller in size, is more scalable and requires less charge pumping circuitry. Furthermore, in the device of the current invention, the use of a program gate for triggering the floating gate is unnecessary, since the floating gate is capacitively coupled to the drain. Such a program gate is, for example, required in prior art devices using Source Side Injection at moderate voltages. The omission of the program gate enables the construction of a smaller memory device as compared to such Source Side Injection based devices. The transistor size in the device of the invention can be less than 1 $\mu m^2$ in a 0.25 $\mu m$ CMOS technology.

The capacitive coupling ratio of the floating gate 12 with respect to the drain 3 is preferably between 0.2 and 0.5. This means that preferably 20 to 50% of the voltage applied to the drain is induced on the floating gate. However, the coupling ratio between the floating gate and the drain can also be any other value deemed suitable by the person skilled in the art.

The substrate 2 is preferably negatively biased with respect to the source 4 during programming of the transistor 1. The effect of negatively biasing the substrate 2 is that the electric field which is created over the first insulating layer 9, i.e. between the floating gate 12 and the substrate 2, is enhanced. This results in the secondary electrons being more strongly attracted by the floating gate 12, so that more secondary electrons are injected onto the floating gate 12 in a given period. Therefore, by negatively biasing the substrate 2 with respect to the source 4, the programming speed of the device according to the invention can be enhanced.

Figure 4:
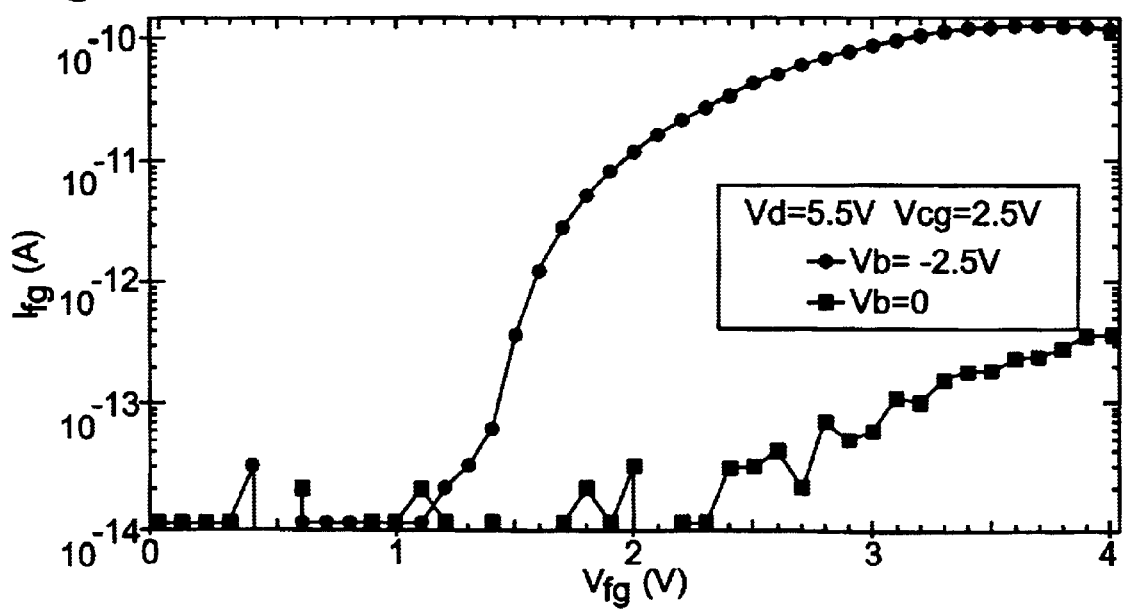
FIG. 4 shows a graph representing the influence of negatively biasing the substrate on the floating gate current in the device according to an exemplary embodiment.

The enhancement in the programming speed is illustrated in FIG. 4, which represents the floating gate current $I_{fg}$ for charging the floating gate as a function of the floating gate voltage $V_{fg}$ (with the source being connected to the ground potential) for a zero substrate bias $V_b$ and a negative substrate bias $V_b$ of −2.5 V, and for a device produced in a 0.25 $\mu m$ CMOS technology. When grounding the substrate 2, only a very small floating gate current $I_{fg}$ is detected because of the poor injection efficiency of the conventional drain hot-electron injection mechanism. However, when a small negative voltage is applied to the substrate (e.g −2.5V), the floating gate current $I_{fg}$ is increased by several orders of magnitude due to secondary electron injection effects originating from a larger silicon electric field in the drain region. This experiment evidences the appearance of an injection mechanism in the memory device according to the exemplary embodiment of the present invention, and it can be used for fast programming at low voltages.

As the memory device of the invention preferably comprises a plurality of transistors arranged in parallel columns and rows, the substrate 2 is preferably locally adapted for ensuring electrical isolation of each transistor for which the substrate is negatively biased with respect to the source 4, from the rest of the substrate. In this way, it can be ensured that transistors which do not have to be programmed, i.e. for which the substrate is not to be negatively biased with respect to the source, are unintentionally programmed.

The device shown in FIG. 3 is preferably provided with a drain junction 14 having a depth D which is optimised for having a highly efficient drain induced secondary impact ionisation. The optimised depth can be achieved by making the drain junction depth D larger than the overlap 13 between the floating gate 12 and the drain 3. The drain junction depth D is preferably between one to four times the overlap 13, or larger. The drain junction 14 is further preferably provided with a halo extension 16 that further increases the secondary electron injection efficiency. The large drain junction depth D is possible in the device since, according to an exemplary embodiment, the electric field between the drain and the source does not need to be very strong.

The device according to an exemplary embodiment shows a programming efficiency which is at least as similar to prior art devices, but at much lower voltages. As previously mentioned, this is achieved by employing the drain induced secondary impact ionisation mechanism, requiring a drain voltage that is less than the supply voltage to the device (e.g., keeping the drain voltage less than a supply voltage of 5 Volts). The low drain voltage allows the use of a thin first insulating layer 9 under the floating gate 12 since drain disturb conditions are largely relaxed. This in turn enables the erase of the floating gate 12 towards the drain 3 by means of tunnelling of electrons through the first insulating layer 9 instead of erasing the floating gate towards the control gate by means of tunnelling of electrons through the second insulating layer 10. As a result, only low voltages are to be applied to the control gate 11, both during programming and erasing of the transistor 1. Consequently, the second insulating layer 10 under the control gate 11 can be scaled in relation to the corresponding CMOS generation, i.e. can be constructed thinner with respect to existing devices, and there is is a lower risk of breakdown of the second insulating layer 10 resulting from a high voltage on the control gate 11.

A second reason why the second insulating layer 10 is very thick in prior art devices, for example split gate devices, is the need for a very large drain coupling to enable injection of primary hot electrons onto the floating gate. As the sum of the respective coupling ratios between the floating gate and the respective components of the transistor surrounding the floating gate equals 1 (by definition), this implies that the coupling ratio between the floating gate 12 and the control gate 11 should be minimized. According to an exemplary embodiment, the control gate coupling is allowed to be larger because a drain coupling on the order of 20% to 50% is sufficient to induce enough voltage on the floating gate to enable the injection of secondary electrons onto the floating gate, which allows a thinner second insulating layer 10.

According to an exemplary embodiment, the first insulating layer 9 preferably has a thickness of at most 50 angstroms (5 nm). The second insulating layer 10 in the first region 7 preferably has a thickness of at most 50 angstroms (5 nm), preferably 35 angstroms (3.5 nm). The second insulating layer 10 in the second region 8 preferably has a thickness of at most 150 angstroms (15 nm), preferably 130 angstroms (13 nm). However, the first and second insulating layers can also have any thickness deemed suitable by the person skilled in the art, and the first and second insulating layer can have the same or different dielectric constants.

It should be noted that the device of the invention is a p-channel device, which means that the drain and the source are switched with respect to the device described in U.S. Pat. No. 5,572,054 (Wang et al.).

The mechanism of drain induced secondary impact ionisation is known as such from U.S. Pat. No. 5,659,504. However, the transistor with which the mechanism of drain induced secondary impact ionisation is used in U.S. Pat. No. 5,659,504 has a different structure than the transistor in the device of the current invention. The transistor in the device described in U.S. Pat. No. 5,659,504 has a so-called "stacked gate" structure. This means that the floating gate and the control gate are stacked above each other, the floating gate being separated from the substrate by a first insulating layer and the control gate being separated from the floating gate by a second insulating layer. The floating gate and the control gate have substantially the same length and extend over the channel region between source and drain. A first main difference with the stacked gate structure is the absence of the split point. A second main difference is that the floating gate does not extend over a substantial portion of the drain, which means that the floating gate is substantially not capacitively coupled to the drain.

In the device of U.S. Pat. No. 5,659,504, the electrons migrating through the channel region from source to drain are heated by means of the voltage difference between the drain and the source. This voltage difference has to be large enough to heat the electrons sufficiently and enable them to impact ionise on the drain. There is no indication in U.S. Pat. No. 5,659,504 that a steep potential drop as the result of a split point can be used for sufficiently heating the electrons.

Furthermore, in the device of U.S. Pat. No. 5,659,504, the floating gate is substantially not capacitively coupled to the drain, so that substantially no part of the drain voltage is induced on the floating gate. This means that substantially no injection of secondary electrons onto the floating gate can be achieved as the result of a capacitive coupling of the floating gate with the drain. The injection of secondary electrons is achieved by applying a voltage to the control gate which is such that it established an electric field attracting the secondary electrons towards the floating gate.

There is no teaching or suggestion in U.S. Pat. No. 5,659,504 that injection of secondary electrons onto the floating gate can be induced by capacitively coupling the floating gate to the drain. Hence, there is no indication in U.S. Pat. No. 5,659,504 that the mechanism of drain induced secondary impact ionisation can be applied for programming a split gate transistor.

In the device of U.S. Pat. No. 5,572,054 the electrons which are injected onto the floating gate are electrons which migrate through the channel region and become heated when they see the steep potential drop as a result of the split point. These electrons could be termed "primary electrons," as they are directly injected from the channel region onto the floating gate. These primary electrons are not generated on the source (or the drain) by means of impact ionisation, which means that they are not secondary electrons. There is no teaching or suggestion in U.S. Pat. No. 5,572,054 that secondary electrons generated by impact ionisation of the source (or the drain) could be injected onto the floating gate of a split gate transistor. Furthermore, there is no teaching or suggestion in U.S. Pat. No. 5,572,054 that primary electrons can be used to generate secondary electrons on the source (or the drain) by means of impact ionisation. Hence, there is no indication in U.S. Pat. No. 5,572,054 that a split gate transistor can be programmed by using the mechanism of drain induced secondary impact ionisation.

It can be concluded that the device of the invention cannot be achieved by simply combining the split gate structure of U.S. Pat. No. 5,572,054 with the programming mechanism of U.S. Pat. No. 5,659,504.

Figure 5:
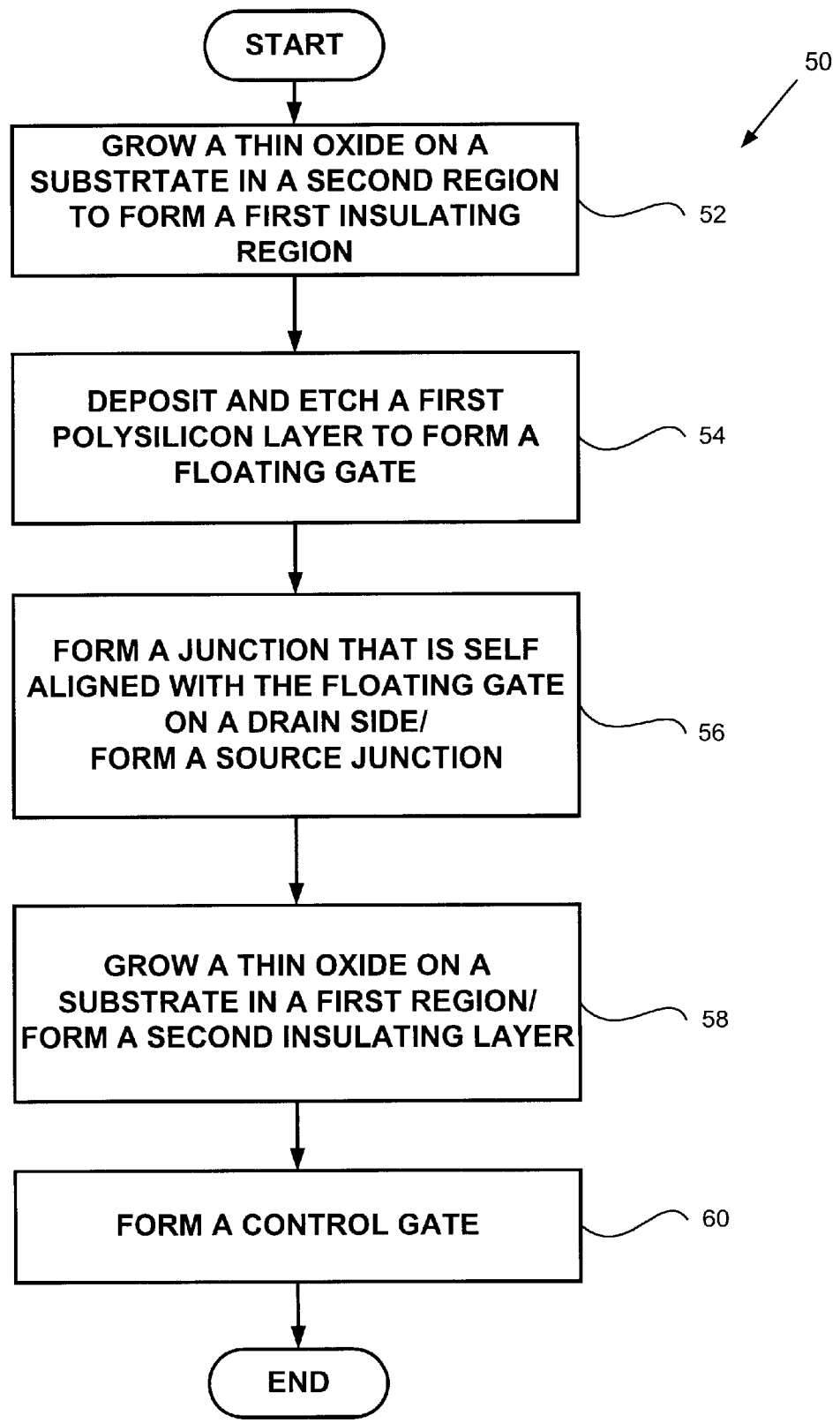
FIG. 5 shows a flow chart illustrating a processing method for creating a device according to an exemplary embodiment.

FIG. 5 is a flow chart illustrating an exemplary processing method 50 for creating the device shown in FIG. 3. Referring to FIG. 5, at step 52, a thin oxide is grown on substrate 2 in a second region (e.g. the second region 8) to form a first insulating layer (e.g. the first insulating layer 9). According to an exemplary embodiment, the first insulating layer is 70 Å for a 0.35 $\mu$m CMOS technology. Next, at step 54, a first polysilicon layer is deposited and etched to form a floating gate such as the floating gates 12 of the transistors 1 as shown in FIG. 3. At step 56, a junction 14 is formed. In one embodiment, the junction 14 is self-aligned with the floating gate 12 on a drain side. Further, the junction 14 can be formed by a deep n$^+$ implantation (preferably combined Phosphorous/Arsenicum junction with a halo). Simultaneously, a source junction, such as source junction 4, is formed in a non-self-aligned manner. Alternatively, it could be formed together with the CMOS junctions (after performing the 2nd polysilicon definition). At step 58, a thin oxide (comparable to the CMOS gate oxide of the corresponding generation, i.e. 55 Å for 0.25 $\mu$m CMOS etc.) is grown on the complementary part of the substrate 2, i.e. in the first region 7. Simultaneously, a second insulating layer, such as second insulating layer 10 is formed. According to an exemplary embodiment, the second insulating layer is formed by placing a thin polyoxide on a top and a sidewall of the floating gate 12. Depending on the oxidation conditions and the doping level of the floating gate 12, this interpoly oxide can be very thin. At step 60, a control gate such as the control gate 11 is formed. According to an exemplary embodiment, the control gate 11 is formed by depositing and etching a second polysilicon layer. At this point, the junctions of the CMOS process are formed, and, eventually, they may be combined with the source junctions of the transistors. The method 50 shows only an exemplary method for creating the device shown in FIG. 3, and the device could also be produced in any other way known to a person skilled in the art.

Figure 6:
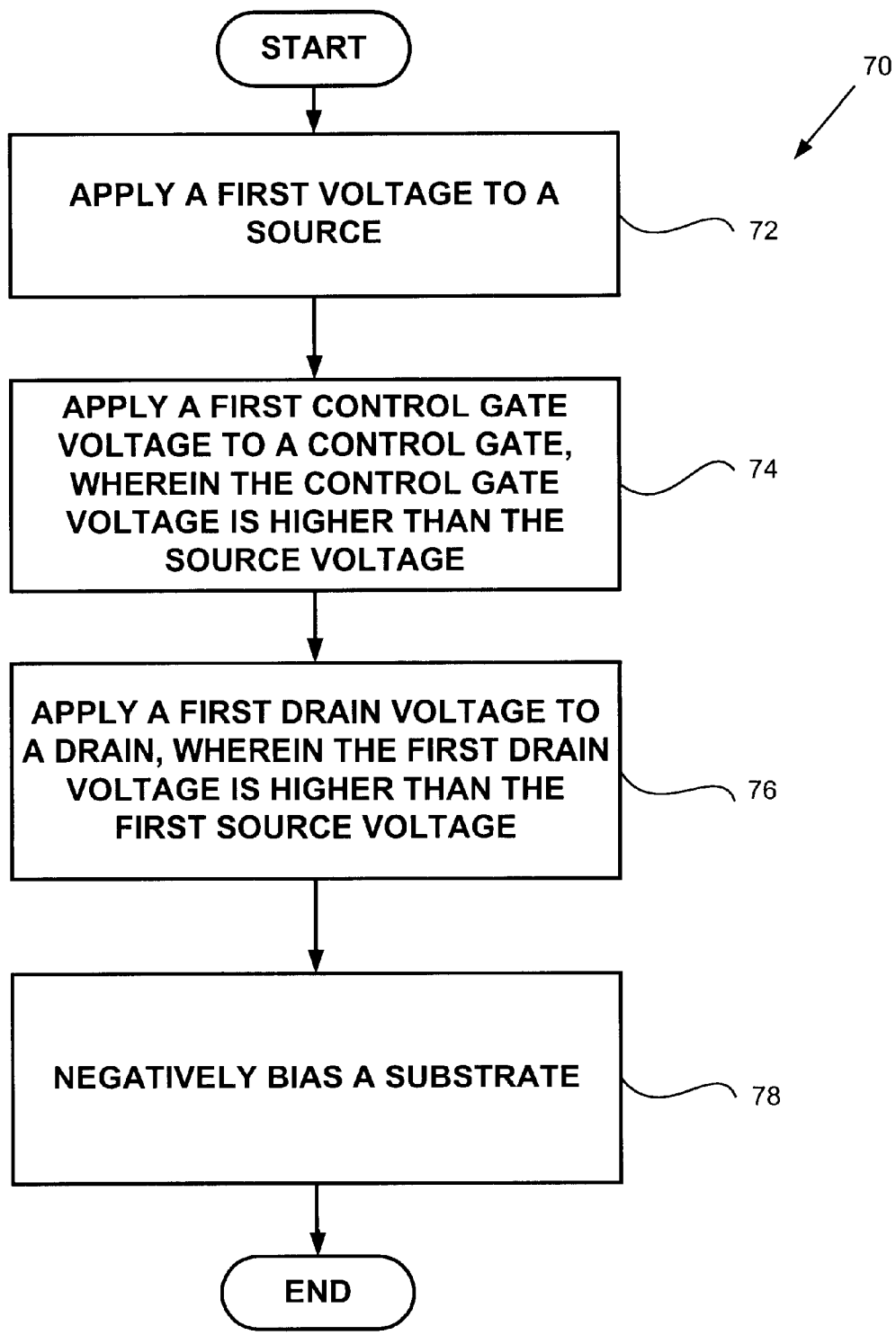
FIG. 6 shows a flow chart illustrating a method for programming a device according to an exemplary embodiment.

FIG. 6 is a flow chart illustrating a method 70 for programming the device shown in FIG. 3, according to an exemplary embodiment. Referring to FIG. 6, at step 72, a first source voltage $V_{s1}$ is applied to the source 4. At step 74, a first control gate voltage $V_{cg1}$ is applied to the control gate 11. At step 76, a first drain voltage $V_{d1}$ is applied to the drain 3. At step 78, the substrate 2 is negatively biased.

According to an exemplary embodiment, the first control gate voltage $V_{cg1}$ is higher than the first source voltage $V_{s1}$. The first control gate voltage's value is chosen in such a way above the first source voltage $V_{s1}$ so the first source voltage $V_{s1}$ is transferred onto the split point 6. For example, the first control gate voltage could be set to a voltage between 1.8 V and 2.5 V higher than the first source voltage $V_{s1}$. Moreover, the first drain voltage $V_{d1}$ has a higher voltage than the first control gate $V_{cg1}$, which in turn has a higher voltage than the first source $V_{s1}$. The first source voltage $V_{s1}$ is preferably the ground potential. The first drain voltage $V_{d1}$ is preferably below the supply voltage to the device of for example 5 V. The voltage difference between the first drain voltage $V_{d1}$ and the first source voltage Vs1 is above the threshold voltage $V_t$ for turning on the channel region 5. The first control gate voltage $V_{cg1}$ is in such a way above the first source voltage $V_{s1}$ that the first source voltage $V_{s1}$ is transferred onto the split point 6. The first drain voltage $V_{d1}$ is further chosen such that a high enough voltage is induced on the floating gate 12, as a result of the capacitive coupling with the drain 3, that injection of secondary electrons, which are generated by impact ionisation on the drain, is enabled.

Further, according to an exemplary embodiment, the substrate 2 is negatively biased by applying to the substrate a substrate voltage $V_b$, which preferably is a negative voltage with respect to the first source voltage $V_{s1}$. The substrate voltage $V_b$ serves to increase the electric field over the first insulating layer 9, so that the injection of secondary electrons onto the floating gate 12 can be enhanced.

In a preferred embodiment, typical programming voltages for the device of the invention in a 0.18 µm technology are: a first source voltage $V_{s1}$ of 0 V (the source is grounded), a first control gate voltage $V_{cg1}$ of around 2V and a first drain voltage $V_{d1}$ of 4–5V which can be supplied from a small charge pumping circuit. A small negative substrate voltage $V_b$ of about –2V or less is preferably applied to the substrate. This brings the floating gate 12 to a potential of about 3V which is sufficient to efficiently trigger the drain enhanced secondary impact ionisation mechanism.

In the device of the invention, tunnelling of electrons from the floating gate to the drain is enabled, because of a suitable capacitive coupling between the floating gate and the drain (e.g. 20 to 50%). The suitable capacitive coupling results from the use of drain induced secondary impact ionisation as a mechanism for programming. Because of the lower drain voltage with respect to the prior art, the first insulating layer between the floating gate and the drain can be constructed thinner. Because of the thinner first insulating layer, a smaller part of the drain voltage has to be induced on the floating gate to enable injection of secondary electrons through the first insulating layer. This means that the capacitive coupling between the floating gate and the drain can have a lower value than in the device of U.S. Pat. No. 5,572,054. In the latter device, the floating gate has to be induced to a higher voltage value, due to use of channel hot (primary) electron injection as mechanism for programming the floating gate. This is because a high source voltage is required to sufficiently heat the primary electrons, which in turn results in the requirement of a thicker first insulating layer between the floating gate and the source in order to prevent breakdown, which in turn leads to the primary electrons needing a higher amount of energy to cross the first insulating layer, so that the floating gate is to be induced to a higher voltage value. The presence of a suitable capacitive coupling between the floating gate and the drain in the device of the invention also leads to a lower voltage (e.g. about 8 V) being required on the drain for erasing the floating gate, with respect to the voltages needed on the control gate in the prior art.

Figure 7:
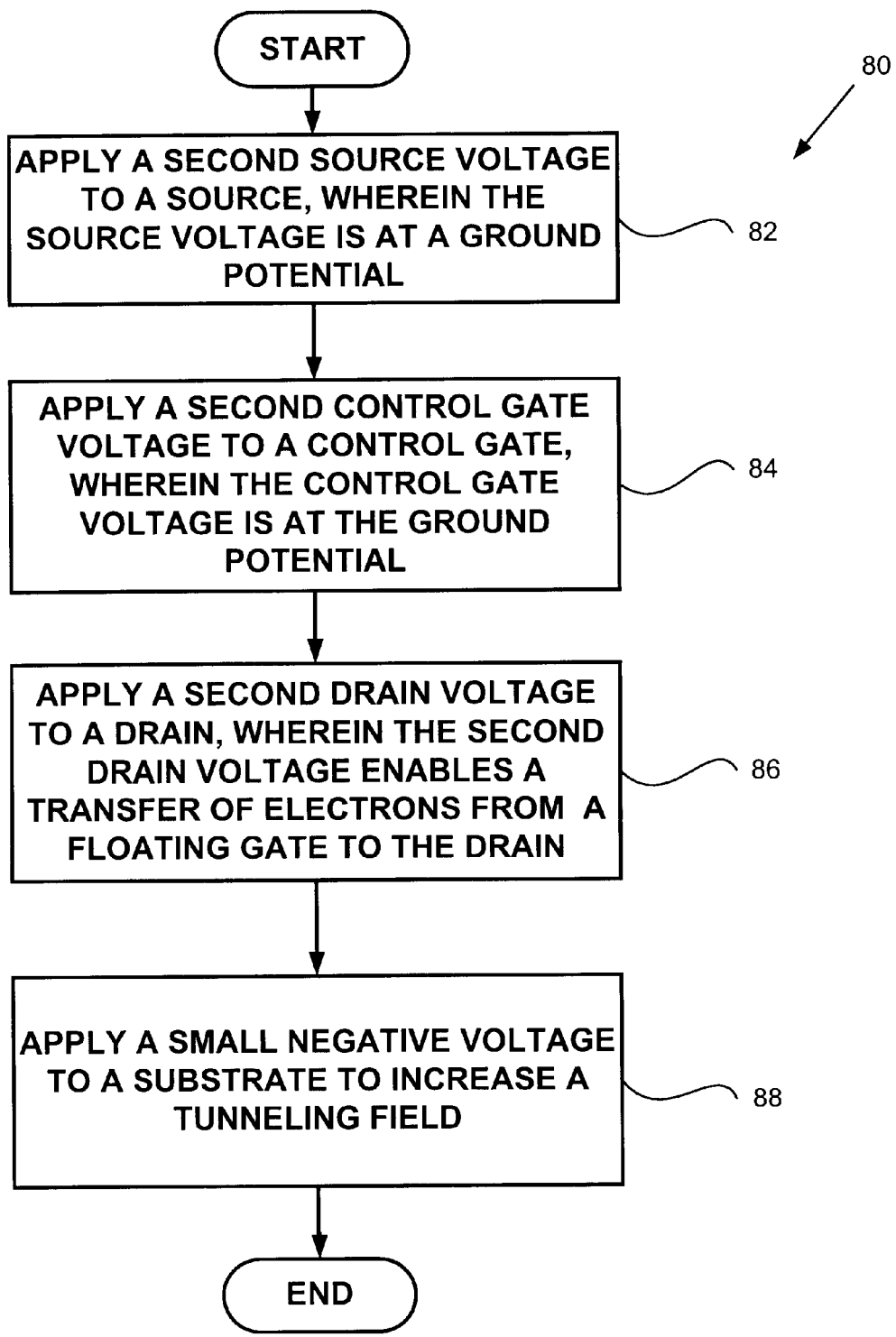
FIG. 7 shows a flow chart illustrating a method for erasing a device according to an exemplary embodiment.

FIG. 7 is a flow chart illustrating a method 80 for erasing the device shown in FIG. 3. Referring to FIG. 7, at step 82, a second source voltage $V_{s2}$ is applied to the source 4. At step 84, a second control gate voltage $V_{cg2}$ is applied to the control gate 11. At step 86, a second drain voltage $V_{d2}$ is applied to the drain 3. At step 88, a small negative voltage is applied to the substrate 2 to further increase the tunnelling field at the floating-gate-to-drain overlap 13.

In a preferred embodiment, the second drain voltage $V_{d2}$ has a higher voltage value than the second source voltage $V_{s2}$ and the second control gate voltage $V_{cg2}$. The second drain voltage $V_{d2}$ is preferably above the supply voltage and second source voltage $V_{s2}$ and the second control gate voltage $V_{cg2}$ are preferably below the supply voltage applied to the device. The second source and control gate voltages $V_{s2}$ and $V_{cg2}$ are preferably the ground potential. The second drain voltage $V_{d2}$ is chosen in such a way above the second control gate voltage $V_{cg2}$ that electrons on the floating gate 12 are transferred to the drain 3 by means of tunnelling, preferably Fowler-Nordheim tunnelling, through the first insulating layer 9.

During erase, the control gate 11 is preferably grounded while the second drain voltage $V_{d2}$ is preferably about 8V. A small negative voltage could be applied to the substrate 2 to further increase the tunneling field at the floating-gate-to-drain overlap 13.

The apparatus and method for erasing is in contrast to what is taught in the prior art. In the prior art, erasing the floating gate is achieved by Fowler-Nordheim tunnelling from the floating gate to the control gate. In the device of U.S. Pat. No. 5,572,054, tunnelling from the floating gate to the source is not possible at a moderate voltage, because the capacitive coupling between the floating gate and the source is too high (80%). In the device of U.S. Pat. No. 5,659,504, tunnelling from the floating gate to the drain is not possible at a moderate voltage, because there is substantially no overlap between the floating gate and the drain. In both prior art devices, the capacitive coupling between the floating gate and the control gate is more desirable for tunnelling than the capacitive coupling between the floating gate and the source or the drain. As a result, in both prior art devices the floating gate is erased by means of tunnelling of electrons from the floating gate to the control gate. It should be noted that in both cases the voltage applied to the control gate for erasing the floating gate is still high (15 V in U.S. Pat. No. 5,572,054; 12 to 20 V in U.S. Pat. No. 5,659,504) with respect to the supply voltage (e.g. 5 V).

Figure 8:
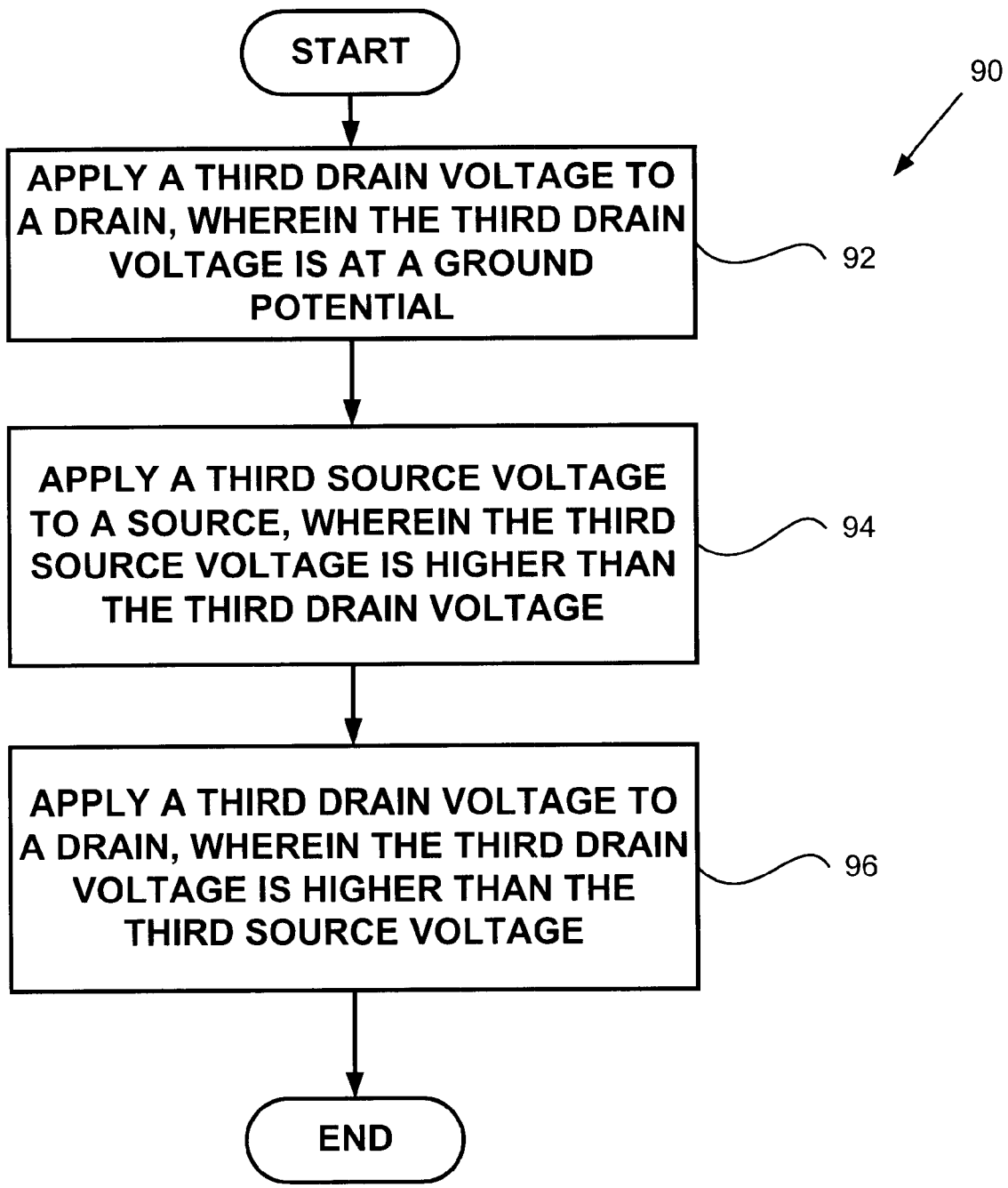
FIG. 8 shows a flow chart illustrating a method for reading a device according to an exemplary embodiment of the present invention.

FIG. 8 is a flow chart illustrating a method 90 for reading the device shown in FIG. 3. Referring to FIG. 8, at step 92, a third drain voltage $V_{d3}$ is applied to the drain 3. At step 94, a third source voltage $V_{s3}$ is applied to the source 4. At step 96, a third control gate voltage $V_{cg3}$ is applied to the control gate 11.

According to an exemplary embodiment, the third control gate voltage $V_{cg3}$ has a higher voltage value than the third source voltage $V_{s3}$, which in turn has a higher voltage value than the third drain voltage $V_{d3}$. The third control gate voltage $V_{cg3}$ is preferably below the supply voltage to the device and the third drain voltage $V_{d3}$ is preferably at the ground potential. As already mentioned above, this method of reading the transistor can be termed "reverse read-out", as the voltage for reading is applied to the source 4 instead of to the drain 3. The "reverse read-out" method has an advantage that the leakage current from floating gate 12 to drain 3 is suppressed, and the reliability of the device is enhanced. The "reverse read-out" is in contrast to the prior art, because for example in the device of U.S. Pat. No. 5,572,054, the higher voltage for reading is applied on the floating gate side of the transistor, i.e. also on the source, but as already mentioned, the drain and source are switched in the prior art device with respect to the device of the invention.

Further, due to the possibility of using the thin insulating layers 9, 10 under control gate 11 and floating gate 12, the device has also a high read-out current. This further implies that the programmed state is a 'hard-off' state since the subthreshold slope of the transistor has a steepness comparable to the CMOS devices in the same technology. For read-out, a source voltage $V_{s3}$ being 1 V higher than the (grounded) drain voltage $V_{d3}$ can be used. A read-out control gate voltage $V_{cg3}$ in between 1.8 and 2.5 higher than the (grounded) drain voltage $V_{d3}$ can be exploited. The substrate 2 is preferably also grounded.

The possible voltages for programming, erasing and reading a transistor in the device shown in FIG. 3 are summarized in a Table 1 shown below.

TABLE 1

|  | $V_s$ (V) | $V_d$ (V) | $V_{cg}$ (V) | $V_b$ (V) |
| --- | --- | --- | --- | --- |
| Program | 0 | 4–5 | 1.8–4 | ~–2 |
| Read-out | 1 | 0 | 1.8–2.5 | 0 |
| Erase | 0 | 8 | 0 | 0 |

Figure 9:
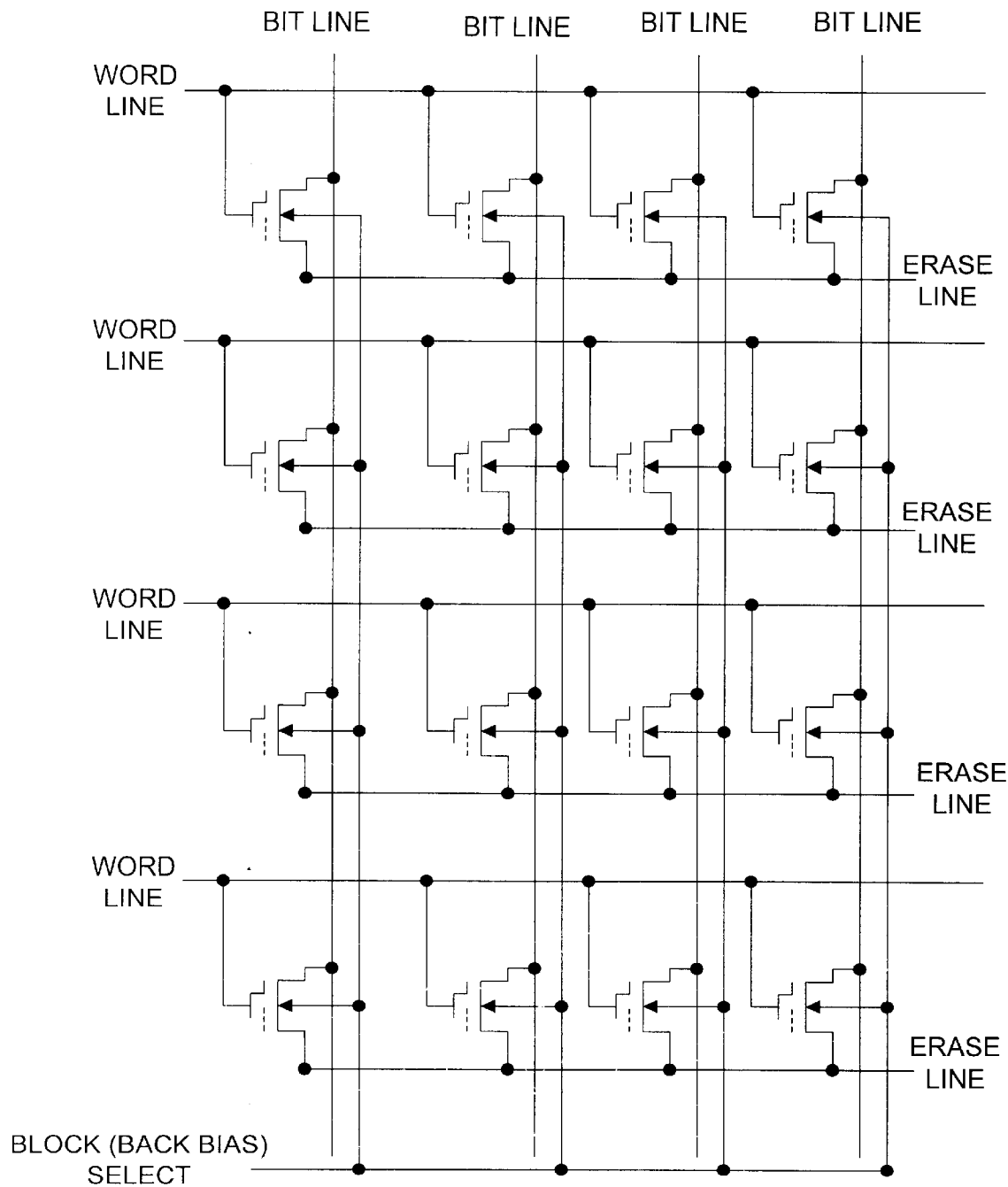
FIG. 9 shows a suitable array configuration for the device according to an exemplary embodiment.

FIG. 9 shows an efficient array organisation for the memory device of the invention when fabricating memory circuits. First, it is noted that the sources 4 of the transistors on a column are to be connected to the vertical bitline, while the drains 3 of the cells on a row are connected to a common horizontal erase line. Advantages of this configuration are that the cell is read-out in the reverse way, which suppresses the Stress-induced Leakage Current in the drain-to-floating gate overlap region. Additionally, the absence of drain coupling during read-out further reduces the amount of electrons to be transferred onto the floating gate 12 for a given external threshold voltage $V_t$, and, thus also the electric field over the first insulating layer 9 under charge storage (or retention) conditions. Secondly, the high erase voltage is only applied to one particular row of cells (or, eventually to a number of adjacent rows) which are to be erased simultaneously as a sector. This ensures that the erase voltage $V_{d2}$ does not disturb the other sectors of the memory (no erase disturb mechanism and thus no need for inhibit voltages). Thirdly, the moderate drain voltage $V_{d1}$ applied during programming will not cause significant charge loss in unselected transistors since the disturb time is limited by the number of words on a row.

Since the drain 3 is connected to a common erase line along a row of cells, the non-selected cells have to be inhibited during programming, i.e. prevented from being programmed unintentionally. This can easily be done as follows: (1) all bitlines are biased at the supply voltage or a slightly larger inhibit voltage (e.g. 2.5 V in a 0.18 µm technology); (2) a row of cells is selected by applying about 1.8V to its wordline and 4–5V to its erase line. Under these conditions, the transistor is not drawing any current since the control-gate channel, i.e. the channel region 2 in the first region 7 under the control gate 11, is cut off; (3) the bitlines of the transistors to be programmed are discharged selectively to ground which causes a current to flow only through these cells. A consequence of this configuration is that the bitline cannot be shared between adjacent columns of transistors. However, it is possible to share the bitline contact between 2 adjacent transistors on the same column in order to reduce the transistor area. For the drain contact (contacting the transistor to the erase line), the situation is somewhat more complicated. If the drain contact is shared between adjacent transistors on the same column, the impact of the drain disturb mechanism during programming is more than doubled because of the absence of a wordline voltage on the adjacent row, which further enhances the tunnelling field across the first insulating layer 9. In practice, this problem requires a compromise between sector size, first insulating layer thickness and drain voltage during programming. Sharing the drain contact between transistors on the same row, or, alternatively, using a diffusion region for erase line routing are other solutions that remove the disturb problem.

In view of the wide variety of embodiments to which the principles of the invention can be applied, it should be understood that the illustrated embodiment is an exemplary embodiment, and should not be taken as limiting the scope of the invention. For example, one of ordinary skill in the art will readily appreciate that various elements of the present invention can be practiced with software, hardware, or a combination of thereof.

The claims should thus not be read as limited to the described order or elements unless stated to that effect. Therefore, all embodiments that come within the scope and spirit of the following claims and equivalent thereto are claimed as the invention.

What is claimed:

1. An electrically programmable and erasable memory device comprising:
   a source;
   a drain;
   a control gate;
   a floating gate, the floating gate extending over at least a portion of the drain, the floating gate not extending over the source; and
   means for injecting onto the floating gate hot electrons generated by drain induced secondary impact ionization.

2. The device as claimed in claim 1, further comprising a channel region, the channel region extending between the source and the drain; and
   wherein the floating gate extends over only a portion of the channel region.

3. The device as claimed in claim 1, wherein the floating gate and the drain are capacitively coupled with a coupling ratio less than 0.5.

4. The device as claimed in claim 1, wherein the means for injecting includes means for inducing Fowler-Nordheim tunnelling of charges from the floating gate to the drain.

5. The device as claimed in claim 1, wherein the hot electrons are injected in a middle section of the floating gate.

6. The device as claimed in claim 1, further comprising:
   a substrate, the substrate having a split point, the split point being situated between the source and the drain and forming a separation between a first region extending from the split point in a first direction towards the source and a second region extending from the split point in a second direction towards the drain; and a channel region, the channel region extending between the source and the drain.

7. The device as claimed in claim 6, wherein the injection means includes:

a first layer of insulating material applied on the substrate and extending in the second region over at least a portion of the drain and at least a portion of the channel region; and a second layer of insulating material applied on the substrate in the first region and separating the substrate and the first region from the control gate, the second insulating layer extending further in the second region and contacting the control gate.

8. The device as claimed in claim 7, wherein the floating gate is sandwiched between the first insulating layer and the second insulating layer and extends over at least a portion of the drain creating an overlap between the floating gate and the drain, and wherein the first insulating layer and the overlap are dimensioned to create a capacitive coupling between the floating gate and the drain enabling injection onto the floating gate of hot electrons generated by drain induced secondary impact ionization.

9. An electrically programmable and erasable memory device comprising:

a substrate including a source, a drain and a channel region extending between the source and the drain, the substrate having a split point situated between the source and the drain and forming a separation between a first region extending from the split point in a first direction towards the source and a second region extending from the split point in a second direction towards the drain;

a first insulating layer applied on the substrate and extending in the second region over at least a portion of the drain and at least a portion of the channel region;

a second insulating layer applied on the substrate in the first region and separating the substrate in the first region from a control gate, the second insulating layer also extending in the second region and contacting the control gate;

a floating gate sandwiched between the first insulating layer and the second insulating layer and extending over at least a portion of the drain to establish an overlap between the floating gate and the drain;

wherein the first insulating layer and the overlap create a capacitive coupling between the floating gate and the drain enabling injection onto the floating gate of hot electrons generated by drain induced secondary impact ionization.

10. The device as claimed in claim 9, wherein the substrate is negatively biased with respect to the source during programming of the memory device.

11. The device as claimed in claim 9, wherein the floating gate and the drain are capacitively coupled with a coupling ratio of 0.2 to 0.5.

12. The device as claimed in claim 9, wherein the second insulating layer in the first region has a thickness of at most 50 angstroms (5 nm).

13. The device as claimed in claim 9, wherein the second insulating layer in the first region has a thickness of 35 angstroms (3.5 nm).

14. The device as claimed in claim 9, wherein the second insulating layer in the second region has a thickness of at most 150 angstroms (15 nm).

15. The device as claimed in claim 9, wherein the second insulating layer in the second region has a thickness of 130 angstroms (13 nm).

16. The device as claimed in claim 9, further comprising a drain junction, the drain junction being between the drain and the substrate, the drain junction having a halo extension.

17. The device as claimed in claim 16, wherein the drain junction has a depth larger than the overlap between the floating gate and the drain.

18. The device as claimed in claim 9, wherein capacitive coupling between the floating gate and the drain enables tunneling of electrons from the floating gate to the drain for erasing the memory device.

19. The device as claimed in claim 18, wherein the capacitive coupling between the floating gate and the drain enables Fowler-Nordheim tunneling of electrons from the floating gate to the drain for erasing the memory device.

20. An electrically programmable and erasable memory device comprising:

a source;

a drain;

a channel region, the channel region extending between the source and the drain;

a control gate;

an insulating layer, the insulating layer being separating the channel region from the control gate;

a floating gate, the floating gate extending over at least a portion of the drain, the floating gate not extending over the source;

means for injecting onto the floating gate hot electrons generated by drain induced secondary impact ionization and;

a substrate, the substrate having a split point, the split point being situated between the source and the drain and forming a separation between a first region extending from the split point in a first direction towards the source and a second region extending from the split point in a second direction towards the drain;

wherein a second insulating layer in the first region has a thickness of at most 50 angstroms (5 nm).

* * * * *